United States Patent [19]
Tuozzolo

[11] Patent Number: 5,796,280
[45] Date of Patent: Aug. 18, 1998

[54] THERMAL LIMIT CIRCUIT WITH BUILT-IN HYSTERESIS

[75] Inventor: Claudio Tuozzolo, Cranston, R.I.

[73] Assignee: Cherry Semiconductor Corporation, East Greenwich, R.I.

[21] Appl. No.: 795,942

[22] Filed: Feb. 5, 1997

Related U.S. Application Data

[60] Provisional application No. 60/011,116, Feb. 5, 1996.

[51] Int. Cl.$^6$ ................................................. H03K 3/037
[52] U.S. Cl. ........................................ 327/205; 327/512
[58] Field of Search .............................. 327/68, 74, 75, 327/205, 206, 478, 512, 513

[56] References Cited

U.S. PATENT DOCUMENTS

| | | | |
|---|---|---|---|
| 3,430,227 | 2/1969 | Hillis | 327/205 |
| 3,573,776 | 4/1971 | Dick et al. | 327/205 |
| 3,796,896 | 3/1974 | Fulton et al. | 327/205 |
| 3,800,168 | 3/1974 | Cochran | 327/205 |
| 4,345,218 | 8/1982 | Congdon et al. | 330/298 |
| 4,554,412 | 11/1985 | Smith | 179/78 R |
| 4,564,879 | 1/1986 | Bienstman | 361/98 |
| 4,667,265 | 5/1987 | Stanojevic et al. | 361/103 |
| 4,800,331 | 1/1989 | Vesce et al. | 323/277 |
| 4,806,787 | 2/1989 | Kato et al. | 327/205 |
| 4,972,136 | 11/1990 | Banura | 323/275 |
| 5,070,322 | 12/1991 | Fukihira et al. | 340/653 |
| 5,099,381 | 3/1992 | Wilcox | 361/103 |
| 5,256,914 | 10/1993 | Boomer | 307/443 |
| 5,267,118 | 11/1993 | Marshall et al. | 361/103 |
| 5,355,123 | 10/1994 | Nishiura et al. | 340/653 |
| 5,565,807 | 10/1996 | Ward | 327/205 |
| 5,610,792 | 3/1997 | DeShazo | 361/103 |

Primary Examiner—Toan Tran
Attorney, Agent, or Firm—Bromberg & Sunstein LLP

[57] ABSTRACT

A thermal shut down circuit with built-in temperature hysteresis, comprising first and second transistors configured as a bistable trigger circuit. The two transistors switch either a first or second emitter current through a bias resistor, thereby establishing a voltage hysteresis. By applying a reference voltage to the base of the first transistor, temperature dependent state transitions occur. A buffer transistor coupled to the collector of the second transistor allows the thermal shut down circuit to turn ON or OFF an auxiliary circuit. Thermal communication between the auxiliary circuit and the base-emitter junction of the first transistor allows the thermal shut down circuit to shut down the auxiliary circuit when the temperature exceeds a shutdown temperature, and thermal hysteresis built into the thermal shut down circuit prevents undesirable ON-OFF oscillation of the auxiliary circuit.

18 Claims, 2 Drawing Sheets

THERMAL LIMIT CIRCUIT WITH BUILT-IN HYSTERESIS

This application claims the benefit of U.S. Provisional Application No. 60/011,116, filed 5 Feb. 1996, the entire disclosure of which is hereby incorporated by reference herein.

FIELD OF INVENTION

This invention relates to a thermal shutdown circuit, and more particularly to a thermal shutdown circuit with built-in thermal hysteresis.

BACKGROUND OF THE INVENTION

Thermal overload protection is an important requirement for high-power voltage regulators to prevent permanent damage due to prolonged operation at excessive temperatures. The maximum operating temperature of a voltage regulator is normally limited by incorporating into the voltage regulator circuit a thermal shutdown circuit or function which provides the necessary protection by sensing the circuit temperature and automatically shutting down the voltage regulator when its temperature exceeds a predetermined threshold value (the shutdown temperature).

Normally, the predictable temperature dependence of the base-emitter voltage ($V_{BE}$) of a transistor is used as the temperature-sensing element. A transistor used for this purpose typically has its base biased at a temperature-stable voltage level which, at room temperature, is insufficient to turn it on. However, due to the negative temperature coefficient (−2mV/° C.) of $V_{BE}$, as the temperature increases, a threshold point is reached where the transistor comes into conduction and shunts away drive current from the output stage of the voltage regulator.

In order to avoid thermal oscillations at temperatures in the proximity of the shutdown temperature, where the circuit may oscillate by turning itself on and off through the thermal shutdown function, it is required to introduce hysteresis into the shutdown circuit. These thermal oscillations should be avoided because they can cause mechanical stresses at the die package interface due to different coefficients of thermal expansion between the package and the die.

In the prior art this problem has been typically addressed by using comparators with hysteresis to implement the thermal shutdown function, considerably adding to the complexity of the circuit.

In view of the foregoing, it would be desirable to be able to provide thermal overload protection with built-in thermal hysteresis without adding greatly to the complexity of the circuit.

SUMMARY OF THE INVENTION

It is an aspect of an embodiment of the present invention to provide a thermal overload protection circuit for high power circuits, such as voltage regulators, which includes built-in thermal hysteresis without greatly adding to the complexity of the circuit.

A thermal overload protection circuit provided in accordance with an embodiment of the present invention includes a first transistor in which a reference voltage is applied to its base. The collector of the first transistor and the base of a second transistor are connected together to define a first node. A first current source provides current to the first node. The emitters of the first and second transistors are connected together to define a second node. A first resistor is coupled between the second node and ground. The collector of the second transistor is connected to a third node, and a second current source provides current to the third node.

The thermal overload protection circuit has a first stable state characterized by the first transistor being ON and conducting a first emitter current, and the second transistor being OFF. The thermal overload protection circuit has a second stable state characterized by the second transistor being ON and conducting a second emitter current, and the first transistor being OFF. The second emitter current is greater than the first emitter current so that the thermal overload protection circuit changes state from the first stable state to the second stable state when the base-emitter junction temperature changes from above a first temperature to below the first temperature, and the thermal overload protection circuit changes state from the second stable state to the first stable state when the base-emitter junction temperature changes from below a second temperature to above the second temperature, where the first temperature is less than the second temperature so that the thermal overload protection circuit exhibits temperature hysteresis.

In a further embodiment, the thermal overload protection circuit is used in a voltage regulator in which the second transistor is coupled to the output stage of a voltage regulator in such a way that the voltage regulator is shut down when the second transistor is OFF.

DETAILED DESCRIPTION OF THE INVENTION

Figure 1:
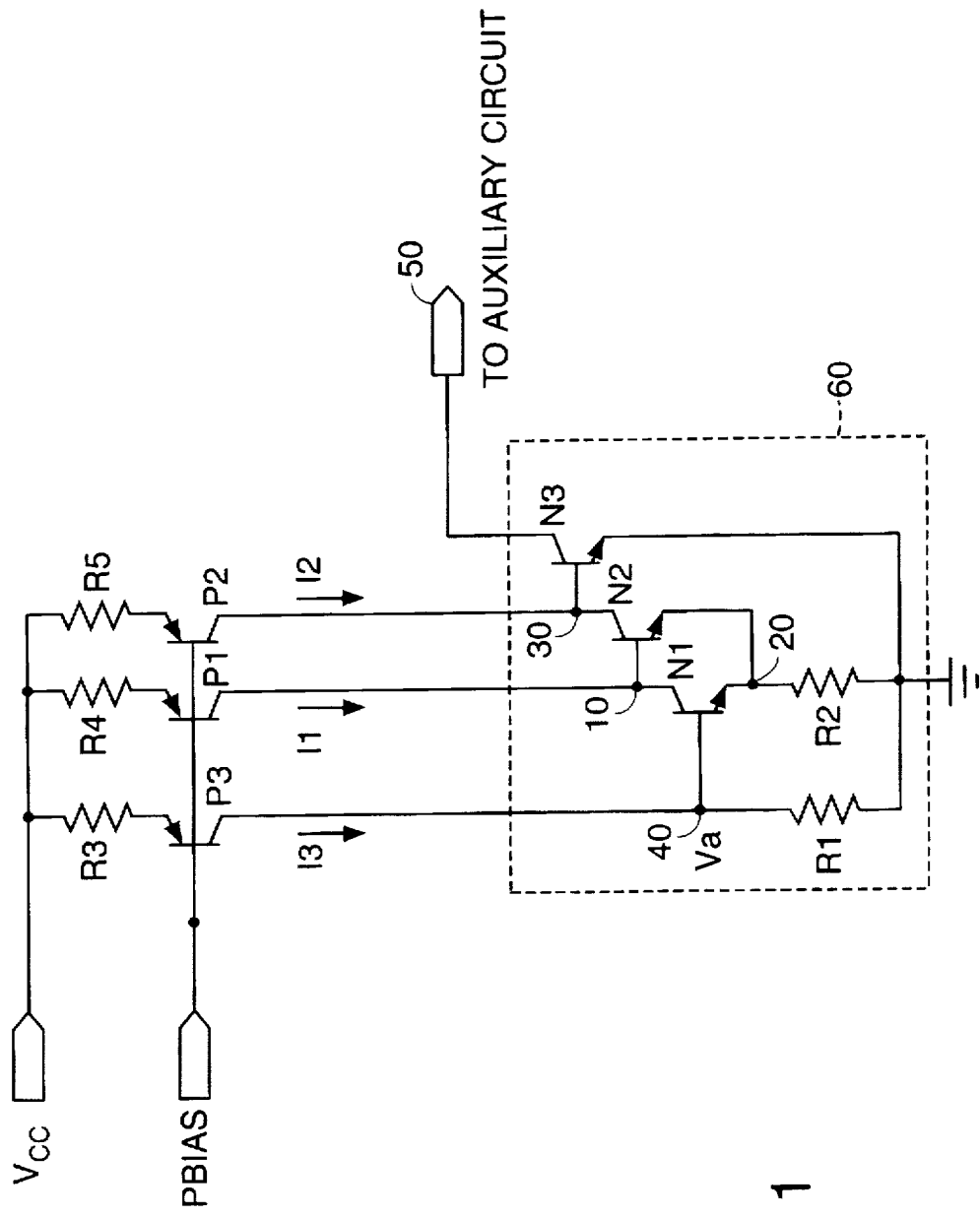
FIG. 1 illustrates an embodiment of the present invention.

In FIG. 1, transistors N1 and N2, and resistor R2, comprise a Schmitt trigger section, in which the collector of transistor N1 is connected to the base of transistor N2 to define node 10, and the emitters of transistors N1 and N2 are connected together at one end of bias resistor R2 to define node 20. A first current source, comprising transistor P1 and emitter resistor R4, supplies current I1 to node 10 and a second current source, comprising transistor P2 and emitter resistor R5, supplies current I2 to node 30. The bases of transistors P1 and transistors P2 are biased by a voltage applied to terminal PBIAS, and a supply voltage is applied at the $V_{cc}$ terminal. Current I1 is actually the current at which transistor P1 is "programmed", i.e., it is the current supplied by the first current source provided its compliance is not exceeded. A similar statement applies to current I2. Other methods of supplying currents to nodes 10 and 30 may be used without departing from the scope of the present invention.

In the circuit of FIG. 1, transistors N1 and N2 are made to operate in one of two stable states. In the first stable state, transistor N1 is ON and transistor N2 is OFF, whereas in the second stable state, transistor N1 is OFF and transistor N2 is ON. This is seen by noting that the base-emitter voltage of transistor N2 is equal to the voltage difference between nodes 10 and 20 (the collector-emitter voltage drop of transistor N1). When transistor N1 is ON, the voltage difference between nodes 10 and 20 is only the saturation voltage of transistor N1, which is insufficient to forward bias the base-emitter junction of transistor N2, and therefore transistor N2 is OFF. However, when transistor N1 is OFF, the voltage at node 10 rises because the first current source is trying to supply current I1. This puts transistor N2 into saturation.

3

The state transition of the circuit of FIG. 1 is determined by whether the voltage Va applied to the base of transistor N1 is sufficient or not to place N1 into conduction. This in turn depends upon the value of the forward biased base-emitter voltage drop across transistor N1 and the voltage at node 20. The voltage at node 20 in turn depends upon the current state of the circuit.

When in the first stable state, transistor N1 is ON and provides an emitter current $I_{e1}$, to node 20, in which case the voltage at node 20 is then $(R2)(I_{e1})$, where we use the symbol R2 to also represent the resistance of resistor R2. When in the second stable state, transistor N2 is ON and provides an emitter current $I_{e2}$ to node 20, in which case the voltage at node 20 is $(R2)(I_{e2})$. Currents I1 and I2 are chosen so that $I_{e2} > I_{e1}$.

We represent the forward biased base-emitter junction voltage of transistor N1 by $V_{BE}(T)$, where T is the base-emitter junction temperature of transistor N1. $V_{BE}(T)$ has a temperature coefficient, $\partial V_{BE}/\partial T$, of approximately —2mV/° C. When in the first stable state, the circuit of FIG. 1 will transition to the second stable state provided $Va < V_{BE}(T) + (R2)(I_{e1})$, and when in the second stable state, the circuit will transition to the first stable state provided $Va > V_{BE}(T) + (R2)(I_{e2})$.

Let us assume that the voltage Va is temperature invariant. Then the circuit of FIG. 1 will exhibit state transitions depending upon the base-emitter junction temperature T. For a given Va, define temperature $T_1$ by $Va = V_{BE}(T_1) + (R2)(I_{e1})$ and define temperature $T_2$ by $Va = V_{BE}(T_2) + (R2)(I_{e2})$. Because $I_{e1} < I_{e2}$ and the temperature coefficient of $V_{BE}(T)$ is negative, we have $T_1 < T_2$. Then, when initially in the first stable state, a state transition from the first stable state to the second stable state will occur when the base-emitter junction temperature transitions from a value above $T_1$ to a value below $T_1$, and when initially in the second stable state, a state transition from the second stable state to the first stable state will occur when the base-emitter junction temperature transitions from a value below $T_2$ to a value above $T_2$. The temperature hysteresis, $\Delta T = T_2 - T_1$, is approximately given by $$\Delta T = \frac{V_{BE}(T_1) - V_{BE}(T_2)}{\partial V_{BE}/\partial T} = \frac{(R2)(I_{e1} - I_{e2})}{\partial V_{BE}/\partial T} = \frac{V_{hyst}}{\partial V_{BE}/\partial T},$$

where the hysteresis voltage, $V_{hyst}$, is defined by $V_{hyst} = (R2)(I_{e1} - I_{e2})$.

In a preferred embodiment, the voltage Va should have a positive temperature variation to provide for additional temperature gain. A voltage Va with a positive temperature variation will cause state transistions to be more ideal in the sense that they occur over small temperature intervals. This can be achieved as shown in FIG. 1 in which a third current source comprising transistor P3 and emitter resistor R3 supplies current I3 to node 40, to which resistor R1 is connected. This third current source can be constructed so that I3 is PTAT (proportional to absolute temperature).

A buffer transistor N3 may be connected to transistor N2 as shown in FIG. 1, where the collector of transistor N3 is connected to an auxiliary circuit (not shown) via terminal 50. When the circuit of FIG. 1 is in the first stable state, transistor N2 is OFF, in which case the second current source increases the voltage at node 30 so that transistor N3 can shunt current from the auxiliary circuit. When the circuit of FIG. 1 is in the second stable state, transistor N2 is ON, so that transistor N3 is OFF and the circuit of FIG. 1 is effectively de-coupled from the auxiliary circuit.

In a preferred embodiment, the voltage drop across resistor R1 biases the base of transistor N1 at a voltage Va of

4 approximately 250 mV at room temperature, so that transistor N1 is OFF at base-emitter junction temperatures below a shutdown temperature which, for controlling a voltage regulator, is preferably set at a temperature of approximately 180° C., although other values may be used depending upon the application.

In general, there is thermal coupling between the auxiliary circuit and the base-emitter junction of transistor N1, so that the circuit of FIG. 1 can turn ON or OFF the auxiliary circuit depending upon whether the base-emitter junction temperature is above or below a shutdown temperature.

Figure 2:
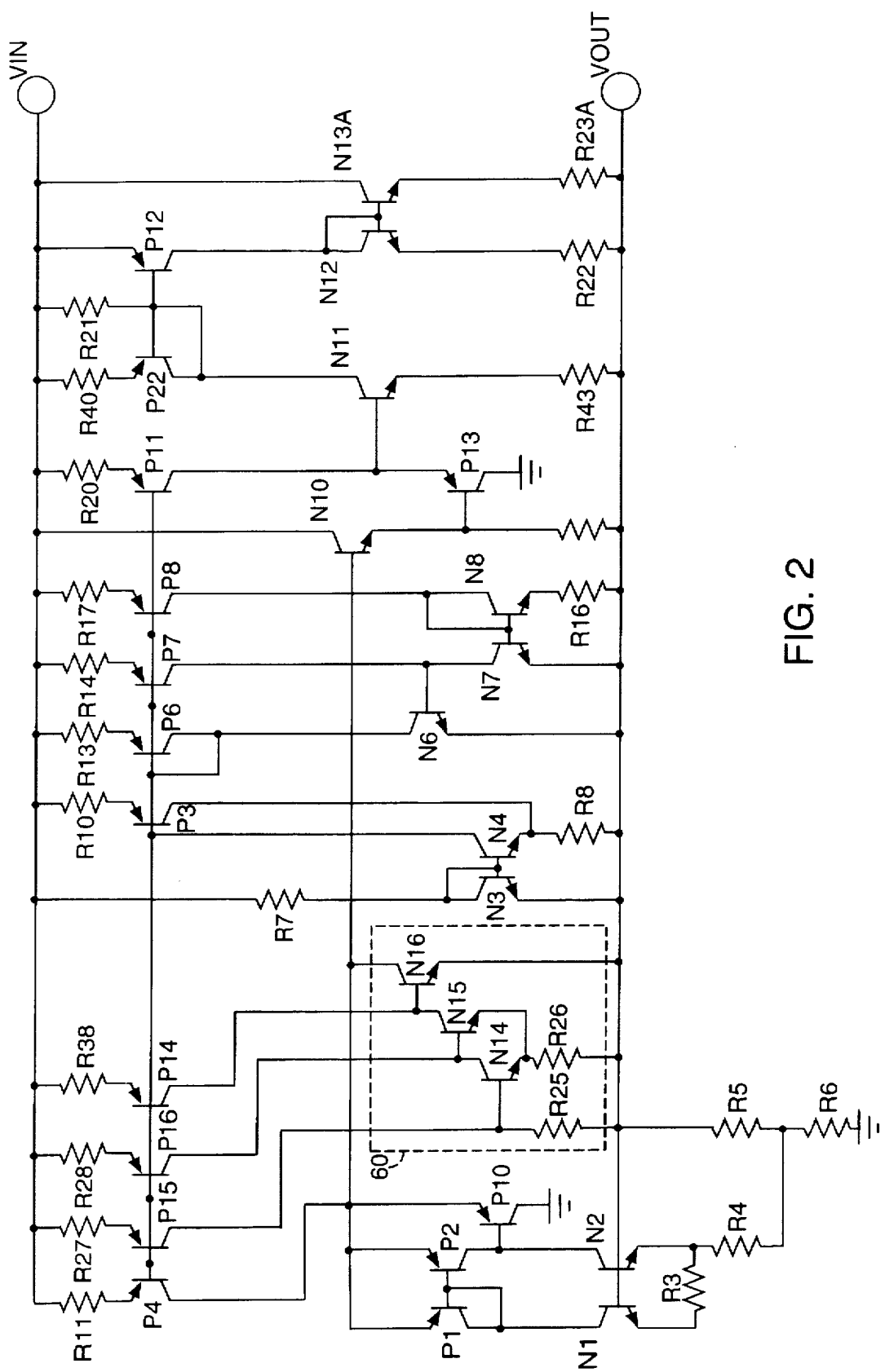
FIG. 2 illustrates the use of the embodiment of FIG. 1 with a voltage regulator.

In FIG. 2 is shown a three-terminal voltage regulator circuit in which the circuit of FIG. 1 is incorporated to shut down the voltage regulator when the temperature is too high. The components of FIG. 1 within the dashed box labeled 60 are shown in FIG. 2 within the dashed box with the same label 60. In the circuit of FIG. 2, the sub-circuit with dashed box 60 shunts current from the output or driver stage of the voltage regulator when in the first stable state.

Modifications can be made to the illustrated embodiments without departing from the scope of the claimed invention.

What is claimed is:

1. A bistable trigger circuit with temperature hysteresis, the bistable trigger circuit comprising:

a first current source to provide a first current to a first node;

a first transistor having a base, having an emitter connected to a second node, having a collector connected to the first node, and having a base-emitter junction temperature;

a second transistor having a base connected to the first node, an emitter connected to the second node, and having a collector connected to a third node;

a second current source to provide a second current to the third node, wherein the bistable trigger circuit has a first stable state characterized by the first transistor being ON and conducting a first emitter current, and the second transistor being OFF; and wherein the bistable trigger circuit has a second stable state characterized by the second transistor being ON and conducting a second emitter current, and the first transistor being OFF;

a reference voltage source, connected to the base of the first transistor, to provide a reference voltage at the base of the first transistor, so that the bistable trigger circuit changes state when the base-emitter junction temperature falls from above a first temperature to below a first temperature and when the base-emitter junction rises from below a second temperature to above the second temperature and wherein the first and second temperatures are distinct so that the bistable trigger circuit exhibits temperature hysteresis and a first resistor connected to the second node to receive the first and second emitter currents, so that the second node has a voltage at a first threshold value when the bistable trigger circuit is in its first stable state and at a second threshold value when the bistable trigger circuit is in its second stable state, and the first threshold value is distinct from the second threshold value.

2. The bistable trigger circuit as set forth in claim 1, wherein the second emitter current is greater than the first emitter current and the first temperature is less than the second temperature.

3. The bistable trigger circuit as set forth in claim 1, wherein the reference voltage exhibits a non-negative temperature coefficient.

4. The bistable trigger circuit as set forth in claim 1, further comprising a third current source and a second resistor where the second resistor is connected to the base of the first transistor to define a fourth node and the third current source provides a third current to the fourth node to provide the reference voltage.

5. The bistable trigger circuit as set forth in claim 1, further comprising a third transistor having a base connected to the third node so that the third transistor is conducting when the bistable trigger circuit is in the first stable state and is OFF when the bistable circuit is in the second stable state.

6. The bistable trigger circuit as set forth in claim 1, wherein the second emitter current is greater than the first emitter current, and wherein the reference voltage exhibits a non-negative temperature coefficient and is provided by a third current source and a second resistor where the second resistor is connected to the base of the first transistor to define a fourth node and the third current source provides a third current to the fourth node.

7. A thermal shutdown circuit with thermal hysteresis for a voltage regulator with an output stage, the thermal shutdown circuit comprising:

a first current source to provide a first current to a first node;

a first transistor having a base, having an emitter connected to a second node, having a collector connected to the first node, and having a base-emitter junction temperature;

a second transistor having a base connected to the first node, an emitter connected to the second node, and having a collector connected to a third node;

a second current source to provide a second current to the third node, wherein the thermal shutdown circuit has a first stable state characterized by the first transistor being ON and conducting a first emitter current, and the second transistor being OFF; wherein the thermal shutdown circuit has a second stable state characterized by the second transistor being ON and conducting a second emitter current, and the first transistor being OFF; and wherein the first emitter current is less than the second emitter current;

resistance means coupled to the second node for providing a voltage proportional to current flowing into the second node, so that the voltage at the second node when the thermal shutdown circuit is in the first state is less than the voltage at the second node when the thermal shutdown circuit is in the second state;

a reference voltage source, connected to the base of the first transistor, to provide a reference voltage with a non-negative temperature coefficient at the base of the first transistor, so that state transitions from the first stable state to the second stable state occur only when the base-emitter junction temperature changes from above a first temperature to below the first temperature, and state transitions from the second stable state to the first stable stage occur only when the base-emitter junction temperature changes from below a second temperature to above the second temperature, wherein the first temperature is less than the second temperature so that the thermal shutdown circuit exhibits temperature hysteresis;

wherein the second transistor is coupled to an output stage of a voltage regulator so that the voltage regulator supplies current to a load when the thermal shutdown circuit is in the second stable state and the voltage regulator is shut down when the thermal shutdown circuit is in the first stable state.

8. A method for thermal shutdown of an auxiliary device, the method comprising the steps of:

sourcing a first current to a first node, wherein a first transistor has a collector connected to the first node, an emitter connected to a second node, a base, and a base-emitter junction temperature;

sourcing a second current to a third node, wherein a second transistor has a collector connected to the third node, a base connected to the first node, and an emitter connected to the second node, wherein the first transistor provides a first emitter current to the second node when the first transistor is ON and the second transistor is OFF, wherein the second transistor provides a second emitter current to the second node when the second transistor is ON and the first transistor is OFF;

providing a voltage at the second node proportional to current provided to the second node;

providing a reference voltage at the base of the first transistor;

coupling the second transistor to the auxiliary circuit so that the auxiliary circuit is ON or OFF in response to the second transistor being ON or OFF;

providing thermal feedback between the auxiliary device and the first transistor so that the base-emitter junction temperature starts to rise when the base-emitter junction temperature changes from above a first temperature to below the first temperature when the first transistor is initially ON and the second transistor is initially OFF, and the base-emitter junction temperature starts to fall when the base-emitter junction temperature changes from below a second temperature to above the second temperature when the first transistor is initially OFF and the second transistor is initially ON.

9. The method as set forth in claim 8, wherein the first temperature is less than the second temperature.

10. The method as set forth in claim 8, wherein the auxiliary device includes a voltage regulator and a pass transistor.

11. A bistable trigger circuit with temperature hysteresis, the bistable trigger circuit comprising:

a first current source to provide a first current to a first node;

a first transistor having a base, having an emitter connected to a second node, having a collector connected to the first node, and having a base-emitter junction temperature;

a second transistor having a base connected to the first node, an emitter connected to the second node, and having a collector connected to a third node;

a second current source to provide a second current to the third node, wherein the bistable trigger circuit has a first stable state characterized by the first transistor being ON and conducting a first emitter current, and the second transistor being OFF; and wherein the bistable trigger circuit has a second stable state characterized by the second transistor being ON and conducting a second emitter current, and the first transistor being OFF, the second emitter current being greater than the first emitter current; and a reference voltage source, connected to the base of the first transistor, to provide a reference voltage at the base of the first transistor, so that the bistable trigger circuit changes state when the base-emitter junction temperature falls from above a first temperature to below a first temperature and when the base-emitter junction rises from below a second temperature to above the second temperature and wherein the first temperature is less than the second temperature so that the bistable trigger circuit exhibits temperature hysteresis.

12. The bistable trigger circuit as set forth in claim 11, wherein the reference voltage exhibits a non-negative temperature coefficient.

13. The bistable trigger circuit as set forth in claim 11, further comprising a third current source and a resistor where the resistor is connected to the base of the first transistor to define a fourth node and the third current source provides a third current to the fourth node to provide the reference voltage.

14. The bistable trigger circuit as set forth in claim 11, further comprising a third transistor having a base connected to the third node so that the third transistor is conducting when the bistable trigger circuit is in the first stable state and is OFF when the bistable circuit is in the second stable state.

15. A bistable trigger circuit with temperature hysteresis, the bistable trigger circuit comprising:

a first current source to provide a first current to a first node;

a first transistor having a base, having an emitter connected to a second node, having a collector connected to the first node, and having a base-emitter junction temperature;

a second transistor having a base connected to the first node, an emitter connected to the second node, and having a collector connected to a third node;

a second current source to provide a second current to the third node, wherein the bistable trigger circuit has a first stable state characterized by the first transistor being ON and conducting a first emitter current, and the second transistor being OFF; and wherein the bistable trigger circuit has a second stable state characterized by the second transistor being ON and conducting a second emitter current, and the first transistor being OFF;

a third transistor having a base connected to the third node so that the third transistor is conducting when the bistable trigger circuit is in the first stable state and is OFF when the bistable circuit is in the second stable state; and a reference voltage source, connected to the base of the first transistor, to provide a reference voltage at the base of the first transistor, so that the bistable trigger circuit changes state when the base-emitter junction temperature falls from above a first temperature to below a first temperature and when the base-emitter junction rises from below a second temperature to above the second temperature and wherein the first and second temperatures are distinct so that the bistable trigger circuit exhibits temperature hysteresis.

16. The bistable trigger circuit as set forth in claim 15, wherein the reference voltage exhibits a non-negative temperature coefficient.

17. The bistable trigger circuit as set forth in claim 15, further comprising a third current source and a resistor where the resistor is connected to the base of the first transistor to define a fourth node and the third current source provides a third current to the fourth node to provide the reference voltage.

18. The bistable trigger circuit as set forth in claim 15, further comprising a first resistor connected to the second node to receive the first and second emitter currents, so that the second node has a voltage at a first threshold value when the bistable trigger circuit is in its first stable state and at a second threshold value distinct from the second threshold value when the bistable trigger circuit is in its second stable state, wherein the second emitter current is greater than the first emitter current, and wherein the reference voltage exhibits a non-negative temperature coefficient and is provided by a third current source and a second resistor where the second resistor is connected to the base of the first transistor to define a fourth node and the third current source provides a third current to the fourth node.

* * * * *